United States Patent [19]

Falk et al.

[11] 4,270,213

[45] May 26, 1981

[54] SEQUENTIAL CHANNEL SELECTOR SYSTEM

[75] Inventors: Terrence F. Falk, Villa Park; Terrence R. Schultz, Park Ridge; James E. Hoffmann, Palatine, all of Ill.

[73] Assignee: Motorola, Inc., Schaumburg, Ill.

[21] Appl. No.: 47,385

[22] Filed: Jun. 11, 1979

[51] Int. Cl.³ .......................... H04B 1/40; H03J 7/18
[52] U.S. Cl. ..................................... 455/77; 455/158; 455/166
[58] Field of Search ................ 325/455, 464, 468–470; 455/76, 77, 154, 158, 159, 161, 165, 166, 183

[56] References Cited

U.S. PATENT DOCUMENTS

| | | | |
|---|---|---|---|
| 3,714,585 | 1/1973 | Koch | 325/468 |
| 3,824,475 | 7/1974 | Pflasterer | 325/470 |
| 3,961,267 | 6/1976 | Weissmueller, Jr. | 325/470 |
| 3,973,228 | 8/1976 | Muller et al. | 325/468 |
| 4,005,368 | 1/1977 | Tanaka | 325/470 |
| 4,063,179 | 12/1977 | Brown | 325/470 |
| 4,064,461 | 12/1977 | Van Eijck | 325/470 |
| 4,123,717 | 10/1978 | Yiu et al. | 325/470 |
| 4,156,193 | 5/1979 | Baker | 325/470 |

OTHER PUBLICATIONS

Engineering Bulletin for Part No. NC 6405, by Nitron Corporation, 2/1977.

Primary Examiner—Jin F. Ng
Attorney, Agent, or Firm—James S. Pristelski; James W. Gillman

[57] ABSTRACT

A channel selector system in a radio for sequentially selecting one of a plurality of channels and rapidly scanning through any restricted channels such that the restricted channels are not displayed and appear to be skipped. The radio includes a frequency synthesizer for generating a predetermined frequency associated with each selected channel and the channel selector system has a signal generator which causes the frequency synthesizer to sequentially either step or scan through the channels including some channels which may be restricted. The generator provides an output coded signal to indicate selection of a restricted channel which is decoded by decoding circuitry. A scan timer is responsive to the decoded signal to cause the signal generator to rapidly scan through restricted channels. A latching circuit latches a signal generator input during rapid scanning through restricted channels until the system advances to the next unrestricted channel. Related methods are disclosed.

11 Claims, 4 Drawing Figures

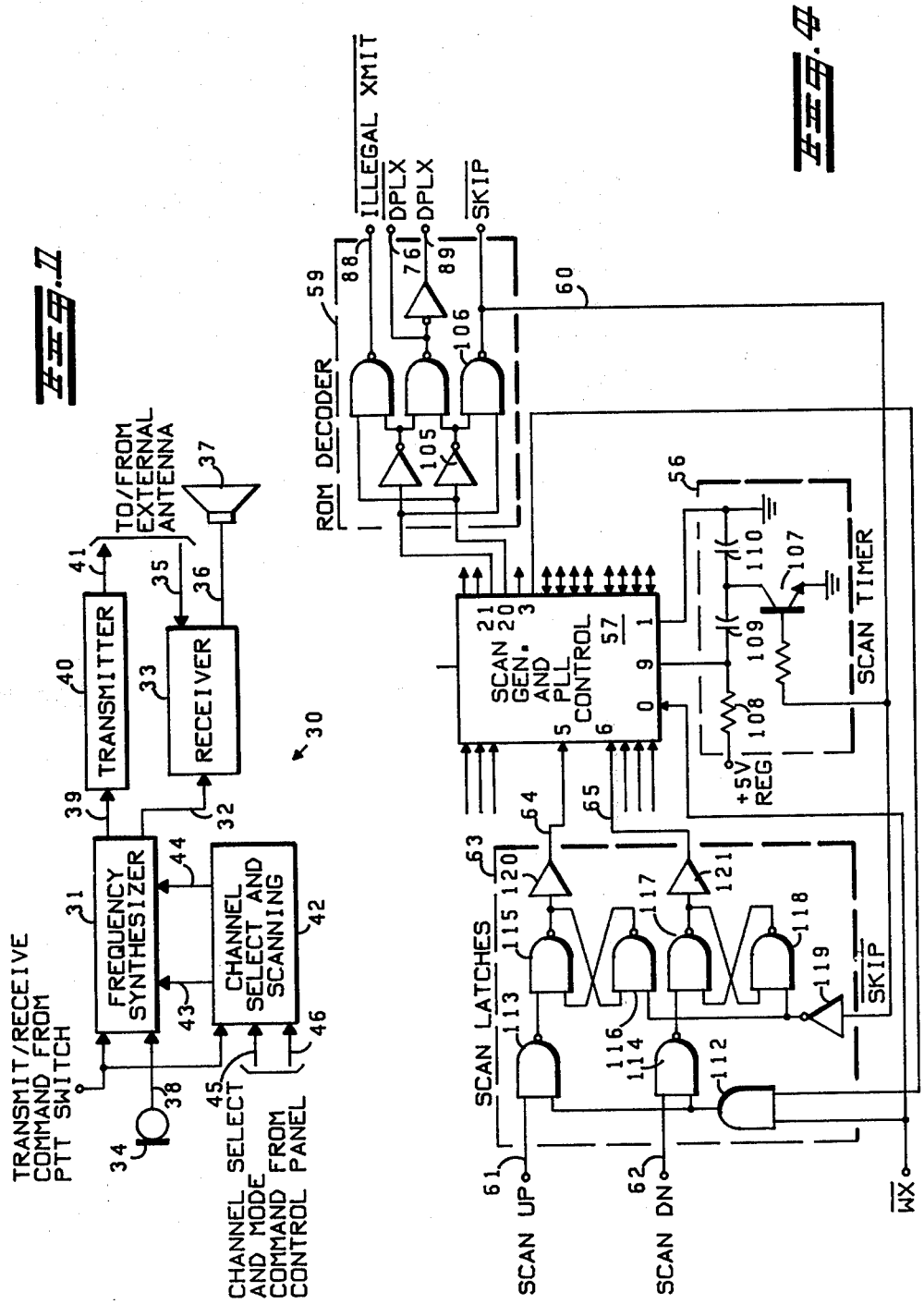

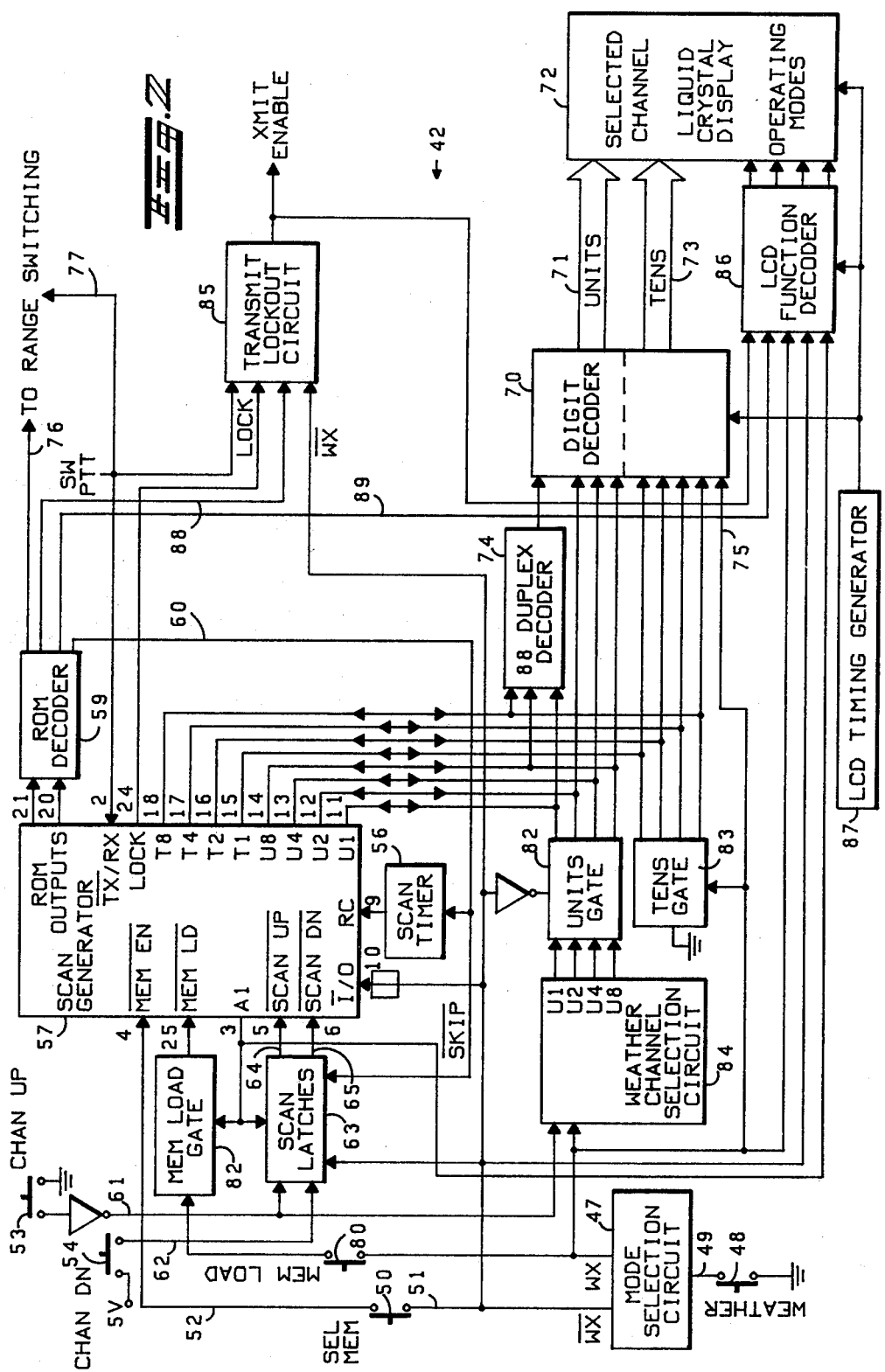

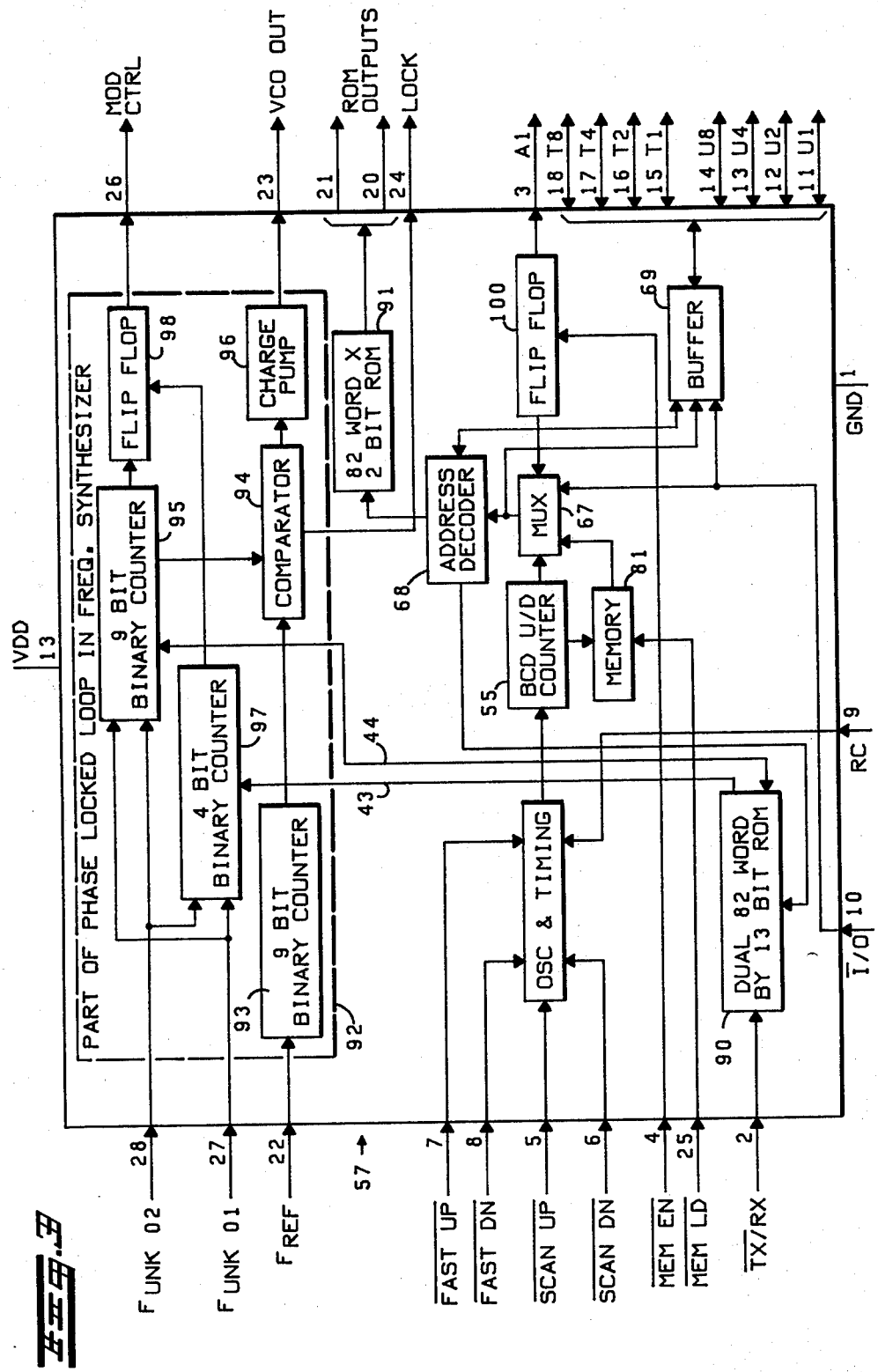

SEQUENTIAL CHANNEL SELECTOR SYSTEM

BACKGROUND OF THE INVENTION

This invention pertains to the radio control art and, more paticularly, to a channel selector system which sequentially accesses one of a plurality of radio channels as by either stepping or scanning sequentially through the channels and rapidly scans through any restricted or illegal channels until the next unrestricted channel is accessed to give the appearance to the radio operator that such restricted channels are skipped and to avoid display of any restricted channels.

It is common in certain communications bands to restrict the usage of certain channels within that band. Certain channels may also be limited to certain operating modes, such as receive only. For example, in the United States the domestic marine channels are in the 156.0 to 162.5 MHz band. Channels 1 through 4 are weather channels and are restricted to receive only operation. That is, no transmission is permitted on these channels. Certain other channels, such as channels, 5, 29-64, 75 and 76, and 89-99 are reserved for various other purposes, such as for coast guard operations, and are restricted in both receiving and transmitting.

Some prior art marine radios utilize individual crystals for each desired channel. Such radios are limited to receiving or transmitting only those channels which have been implemented by the associated frequency crystal. There was therefore no problem of accessing a restricted channel since the radio could only receive or transmit on the implemented channels and crystals for the restricted channels were generally unavailable to the public.

More recently, frequency synthesizers have been utilized to generate the frequencies to enable receiving or transmitting on a plurality of channels within the communication band. The frequency synthesizer eliminates the need for a separate and individual crystal for each of the center frequencies of the desired channels. Sequential scanning or generating circuits are commonly employed to serially advance the frequency synthesizer from one channel to an adjacent channel in either an up mode (increasing channel numbers) or in a down mode (decreasing channel numbers). In so doing, the numbers of restricted channels as well as unrestricted channels are often displayed. While the radio may be coded to prevent reception or transmission on the restricted channels, there is the possibility that reception or transmission on restricted channels may occur due to receive malfunction or due to illegal modification of the receiver to achieve this capability. Furthermore, a significant amount of time and operator inconvenience may be entailed in serially advancing from the last unrestricted channel through a plurality of restricted channels to the next unrestricted channel. For example, to advance from channel 28 to the next unrestricted channel 65 requires advancing through 36 restricted channels, namely channels 29-64.

SUMMARY OF THE INVENTION

Accordingly, it is a principal object of the present invention to eliminate or minimize the possibility of accessing a restricted or illegal channel by the radio operator.

A related object of the present invention is to provide a channel selector system having significantly faster scanning rate through restricted channels than through unrestricted channels such that it appears that the radio skips from the last unrestricted channel through any restricted channels to the next unrestricted channel.

A further object of the present invention is to latch a sequential generating means when scanning at the faster rate through the restricted channels such that any change in operator input has no effect upon scanning through the restricted channels and advancing to the next unrestricted channel and the channel selector system will therefore not stop in a restricted channel due to any change in operator input.

Another object of the present invention is to cease scanning at the faster scan rate through the restricted channels and return to the normal scan rate when the next unrestricted channel is accessed.

Yet another object of the present invention is to provide methods of eliminating the possibility of accessing restricted channels and to prevent restricted channels from being displayed to the radio operator in a radio of this type which sequentially scans through restricted as well as unrestricted channels.

The channel selector system of the present invention enables a radio to receive an unrestricted one of a plurality of sequentially accessed channels while eliminating the possibility of selecting or accessing an illegal or restricted channel. A frequency synthesizer is responsive to a channel selector to generate a predetermined center frequency associated with each selected channel such that the radio may receive information, or transmit information, on the selected channel. The system basically includes sequential generating means to cause the frequency synthesizer to sequentially access an adjacent channel of the plurality of channels either at a predetermined scanning rate or in a step-by-step manner and provide an output coded signal for any channels which are restricted, decoding means responsive to the output coded signal from the sequential generating means to provide a decoded signal upon accessing of a restricted channel, and timer means responsive to a change in output signal from the decoding means upon accessing of a restricted channel to cause the sequential generating means to rapidly scan through any restricted channels to the next unrestricted channel. It thereby appears to the radio operator that the channel selector system has skipped the restricted channels and jumped from the last unrestricted channel to the next unrestricted channel and any restricted channels are not displayed to the operator. The system also preferably includes latching means for latching the sequential generating means in the faster scanning or skip rate until the next unrestricted channel is accessed such that any change in channel selection controls by the radio operator during the channel skip mode over restricted channels will not cause the channel selector system to stop in a restricted channel. The channel selector system prevents accessing of restricted channels while sequentially scanning either up or down through the channels and the latching means latches the sequential scanning means in either scanning direction. The scanning rate is preferably increased by the timer means from the normal channel scanning rate of about 4 channels per second through unrestricted channels to about 400 channels per second during the skip mode through restricted channels such that a plurality of adjacent restricted channels are quickly scanned through and there is not sufficient time for any of the restricted channels to be displayed on a digital channel display means.

The present invention is also concerned with methods for preventing restricted channels from being accessed or displayed. The basic method includes the steps of selecting an adjacent channel by means of a control input to a sequential generating means, providing an output code from the sequential generating means for selected adjacent channel, decoding the output code from the sequential generating means to determine whether the selected adjacent channel is a restricted channel, and supplying a timing singal to said sequential generating means upon determining that a restricted channel has been selected such that said signal generating means rapidly scans through any restricted channel to the next unrestricted channel and the restricted channels are therefore not visually displayed. An additional step of latching the sequential generating means into the high scan rate until the next unrestricted channel is accessed eliminates the possibility that the channel scanning will stop in a restricted channel due to any change in operator controls.

BRIEF DESCRIPTION OF THE DRAWINGS

FIG. 1 is a schematic diagram in block form illustrating a radio capable of both receiving and transmitting information with the novel channel select and scanning means of the present invention controlling a frequency synthesizer to select one of a plurality of channels.

FIG. 2 is an electrical schematic diagram also substantially in block form illustrating the channel select and scanning means of FIG. 1 in greater detail.

FIG. 3 is a functional block diagram of the scan generator and phase locked loop (PLL) control block of FIG. 2.

FIG. 4 is an electrical schematic diagram with the scan generator and PLL control circit of FIG. 3 in block form and further schematically illustrating the ROM decoder, scan timer, and scan latch blocks of FIG. 2.

DESCRIPTION OF THE PREFERRED EMBODIMENT

Referring to FIG. 1, there is shown a radio, generally designated 30, suitable for use in the marine radio telephone frequency band. A frequency synthesizer 31 ordinarily provides an IF injection signal on a line 32 to a receiver portion 33 of the radio when a PTT switch (not shown but usually located on a microphone 34 for user convenience) is in the receive position. Receiver 33 also receives RF signals from an external antenna (not shown) on an antenna input line 35. Receiver 33 provides an audio signal on a line 36 to a speaker 37 from one of a plurality of channels, as will be more completely discussed hereinafer, in accordance with the frequency of the IF injection signal on line 32 from frequency synthesizer 31. When the PTT switch is in the transmit position, frequency synthesizer 31 frequency modulates an audio signal from microphone 34 on a line 38 and provides a frequency-modulated RF excitation signal at an appropriate selected channel frequency on a line 39 to a transmitter 40. Transmitter 40 in turn provides an RF output signal on a line 41 to the external antenna.

Channel select, scanning and display circuitry 42 provides transmit frequency and receive frequency information to frequency synthesizer 31 via respective lines 43 and 44 in response to channel select and mode command controls having inputs to circuitry 42 on a pair of respective input lines 45 and 46. The operation of channel select, scanning and display circuitry 42 is more completely disclosed hereinafter.

Before proceeding with the detailed description of the present invention, an understanding of the make-up of the marine radio telephone band is helpful to fully appreciate the operation and advantages of the present invention. As can be seen from Table 1, below, channels 1, 2, 3 and 4 are reserved for the broadcasting of weather information. No transmitting is permitted on these receive only channels. Channels 5, 29–64, 75 and 76, and 89–99 are restricted or illegal channels, most of which are reserved for U.S. governmental use. Neither transmission nor reception on these restricted channels by the general public is permitted. The remaining 46 channels, namely channels 6–28, 65–74 and 77–88 duplex are generally available for public reception or transmission with the exception of channels 15, 21, 81, 82 and 83 which are coast guard channels and may be received only.

The frequency allocations of the channels are interleaved so that channel position, in order of increasing frequency is 06, 65, 07, 66, 08, 67, etc. The various channels are designated for either simplex or duplex operation. On simplex channels, the receive and transmit frequencies are always identical. On duplex channels, the receive frequency is always 4.6 MHz higher than the transmit frequency. Channel 88 is receivable in either simplex or duplex operation. The significance of the address lines code and ROM code in Table 1 will become more apparent hereinafter.

TABLE I

| CHANNEL | TRANSMIT CARRIER FREQUENCY (MHz) | RECEIVE CARRIER FREQUENCY (MHz) | ADDRESS LINES CODE(10) | | | | | | | | ROM CODE | |
|---|---|---|---|---|---|---|---|---|---|---|---|---|
| | | | T8 | T4 | T2 | T1 | U8 | U4 | U2 | U1 | 20 | 21 |
| 1 | — | 162.550 | 0 | 0 | 0 | 0 | 0 | 0 | 0 | 1 | 0 | 0 |
| 2 | — | 162.400 | 0 | 0 | 0 | 0 | 0 | 0 | 1 | 0 | 0 | 0 |
| 3 | — | 162.475 | 0 | 0 | 0 | 0 | 0 | 0 | 1 | 1 | 0 | 0 |
| 4 | — | 161.650 | 0 | 0 | 0 | 0 | 0 | 1 | 0 | 0 | 0 | 0 |
| 06 | 156.300 | 156.300 | 0 | 0 | 0 | 0 | 0 | 1 | 1 | 0 | 1 | 1 |
| 07 | 156.350 | 156.350 | 0 | 0 | 0 | 0 | 0 | 1 | 1 | 1 | 1 | 1 |
| 08 | 156.400 | 156.400 | 0 | 0 | 0 | 0 | 1 | 0 | 0 | 0 | 1 | 1 |
| 09 | 156.450 | 156.450 | 0 | 0 | 0 | 0 | 1 | 0 | 0 | 1 | 1 | 1 |
| 10 | 156.500 | 156.500 | 0 | 0 | 0 | 1 | 0 | 0 | 0 | 0 | 1 | 1 |
| 11 | 156.550 | 156.550 | 0 | 0 | 0 | 1 | 0 | 0 | 0 | 1 | 1 | 1 |
| 12 | 156.600 | 156.600 | 0 | 0 | 0 | 1 | 0 | 0 | 1 | 0 | 1 | 1 |
| 13 | 156.650 | 156.650 | 0 | 0 | 0 | 1 | 0 | 0 | 1 | 1 | 1 | 1 |
| 14 | 156.700 | 156.700 | 0 | 0 | 0 | 1 | 0 | 1 | 0 | 0 | 1 | 1 |
| 15 | 156.750 | 156.750 | 0 | 0 | 0 | 1 | 0 | 1 | 0 | 1 | 1 | 0 |
| 16 | 156.800 | 156.800 | 0 | 0 | 0 | 1 | 0 | 1 | 1 | 0 | 1 | 1 |
| 17 | 156.850 | 156.850 | 0 | 0 | 0 | 1 | 0 | 1 | 1 | 1 | 1 | 1 |
| 18 | 156.900 | 156.900 | 0 | 0 | 0 | 1 | 1 | 0 | 0 | 0 | 1 | 1 |

TABLE I-continued

| CHANNEL | | TRANSMIT CARRIER FREQUENCY (MHz) | RECEIVE CARRIER FREQUENCY (MHz) | ADDRESS LINES CODE(10) | | | | | | | | ROM CODE | |
|---|---|---|---|---|---|---|---|---|---|---|---|---|---|
| | | | | T8 | T4 | T2 | T1 | U8 | U4 | U2 | U1 | 20 | 21 |
| | 19 | 156.950 | 156.950 | 0 | 0 | 0 | 1 | 1 | 0 | 0 | 1 | 1 | 1 |
| DPLX | 20 | 157.000 | 161.600 | 0 | 0 | 1 | 0 | 0 | 0 | 0 | 0 | 0 | 0 |
| | 21 | 157.050 | 157.050 | 0 | 0 | 1 | 0 | 0 | 0 | 0 | 1 | 1 | 0 |
| | 22 | 157.100 | 157.100 | 0 | 0 | 1 | 0 | 0 | 0 | 1 | 0 | 1 | 1 |
| | 23 | 157.150 | 157.150 | 0 | 0 | 1 | 0 | 0 | 0 | 1 | 1 | 1 | 0 |
| DPLX | 24 | 157.200 | 161.800 | 0 | 0 | 1 | 0 | 0 | 1 | 0 | 0 | 0 | 0 |
| DPLX | 25 | 157.250 | 161.850 | 0 | 0 | 1 | 0 | 0 | 1 | 0 | 1 | 0 | 0 |
| DPLX | 26 | 157.300 | 161.900 | 0 | 0 | 1 | 0 | 0 | 1 | 1 | 0 | 0 | 0 |
| DPLX | 27 | 157.350 | 161.950 | 0 | 0 | 1 | 0 | 0 | 1 | 1 | 1 | 0 | 0 |
| DPLX | 28 | 157.400 | 162.000 | 0 | 0 | 1 | 0 | 1 | 0 | 0 | 0 | 0 | 0 |
| | 29 | — | — | 0 | 0 | 1 | 0 | 1 | 0 | 0 | 1 | 0 | 1 |
| | . . . | | | . . . . . . . . . . . . . . . . . . . . . . . . . . . . | | | | | | | | | |
| | . . . | | | . . . . . . . . . . . . . . . . . . . . . . . . . . . . | | | | | | | | | |
| | 64 | — | — | 0 | 1 | 1 | 0 | 0 | 1 | 0 | 0 | 0 | 1 |
| | 65 | 156.275 | 156.275 | 0 | 1 | 1 | 0 | 0 | 1 | 0 | 1 | 1 | 1 |
| | 66 | 156.325 | 156.325 | 0 | 1 | 1 | 0 | 0 | 1 | 1 | 0 | 1 | 1 |
| | 67 | 157.375 | 156.375 | 0 | 1 | 1 | 0 | 0 | 1 | 1 | 1 | 1 | 1 |
| | 68 | 156.425 | 156.425 | 0 | 1 | 1 | 0 | 1 | 0 | 0 | 0 | 1 | 1 |
| | 69 | 156.475 | 156.475 | 0 | 1 | 1 | 0 | 1 | 0 | 0 | 1 | 1 | 1 |
| | 70 | 156.525 | 156.525 | 0 | 1 | 1 | 1 | 0 | 0 | 0 | 0 | 1 | 1 |
| | 71 | 156.575 | 156.575 | 0 | 1 | 1 | 1 | 0 | 0 | 0 | 1 | 1 | 1 |
| | 72 | 156.625 | 156.625 | 0 | 1 | 1 | 1 | 0 | 0 | 1 | 0 | 1 | 1 |
| | 73 | 156.675 | 156.675 | 0 | 1 | 1 | 1 | 0 | 0 | 1 | 1 | 1 | 1 |
| | 74 | 156.725 | 156.725 | 0 | 1 | 1 | 1 | 0 | 1 | 0 | 0 | 1 | 1 |
| | 75 | — | — | 0 | 1 | 1 | 1 | 0 | 1 | 0 | 1 | 0 | 1 |
| | 76 | — | — | 0 | 1 | 1 | 1 | 0 | 1 | 1 | 0 | 0 | 1 |
| | 77 | 156.875 | 156.875 | 0 | 1 | 1 | 1 | 0 | 1 | 1 | 1 | 1 | 1 |
| | 78 | 156.925 | 156.925 | 0 | 1 | 1 | 1 | 1 | 0 | 0 | 0 | 1 | 1 |
| | 79 | 156.975 | 156.975 | 0 | 1 | 1 | 1 | 1 | 0 | 0 | 1 | 1 | 1 |
| | 80 | 157.025 | 157.025 | 1 | 0 | 0 | 0 | 0 | 0 | 0 | 0 | 1 | 1 |
| | 81 | 157.075 | 157.075 | 1 | 0 | 0 | 0 | 0 | 0 | 0 | 1 | 1 | 0 |
| | 82 | 157.125 | 157.125 | 1 | 0 | 0 | 0 | 0 | 0 | 1 | 0 | 1 | 0 |
| | 83 | 157.175 | 157.175 | 1 | 0 | 0 | 0 | 0 | 1 | 0 | 0 | 0 | 0 |
| DPLX | 84 | 157.225 | 161.825 | 1 | 0 | 0 | 0 | 0 | 1 | 0 | 0 | 0 | 0 |
| DPLX | 85 | 157.325 | 161.875 | 1 | 0 | 0 | 0 | 0 | 1 | 0 | 1 | 0 | 0 |
| DPLX | 86 | 157.325 | 161.925 | 1 | 0 | 0 | 0 | 0 | 1 | 1 | 0 | 0 | 0 |
| DPLX | 87 | 157.375 | 161.975 | 1 | 0 | 0 | 0 | 0 | 1 | 1 | 1 | 0 | 0 |
| | 88 | 157.425 | 157.425 | 1 | 0 | 0 | 0 | 1 | 0 | 0 | 0 | 1 | 1 |
| DPLX | 88 | 157.425 | 162.025 | 1 | 0 | 0 | 0 | 1 | 0 | 0 | 1 | 0 | 0 |

The channel select, scan and display circuitry 42 of FIG. 1 is shown in greater detail in FIGS. 2, 3 and 4. The general operation of circuitry 42 is as follows. A mode selection circuit 47 and a scan generator and PLL control circuit 57 (hereinafter "scan generator") are responsible for determining the mode of operation of the circuitry 42. Mode selection circuit 47 is controlled by a WEATHER pushbutton 48. Pulsing of WEATHER button 48 presents a logic zero level on a line 49 to mode selection circuit 47 and causes the mode selection circuit to alternately switch between the weather mode in which an output line WX is at a logic one level and between the select or memory mode wherein output $\overline{WX}$ is a logic one level.

Pulsing of a SEL/MEM button 50 alternatively switches scan generator 57 between the select and memory modes. Since SEL/MEM button 50 is connected by a line 51 to output $\overline{WX}$ of mode selection circuit 47, the SEL/MEM button is disabled when mode selection circuit 47 is in the weather mode.

Channel selection in the select mode is controlled by CHAN UP and CHAN DN buttons 53 and 54, respectively. Depressing either CHAN UP button 53 or CHAN DN button 54 causes a BCD counter 55 (FIG. 3), internal to the scan generator 57, to sequentially scan all channels between channels 06 and 88 duplex. Scanning terminates when button 53 or 54 is released and channels will be sequentially accessed in a channel-by-channel manner if button 53 or 54 is pulsed. The scan rate is controlled by a scan timer 56 having an input RC to a terminal 9 of scan generator 57. The normal scan rate is about four channels per second for unrestricted channels. Illegal channels, such as channels 29–64 and channels 75 and 76, have a unique 01 ROM code as seen in Table 1. This code is present at output terminals 20 and 21 of scan generator 57 whenever the contents of BCD counter 55 address an illegal channel. A ROM decoder 59 decodes this two digit code to a single binary output $\overline{SKIP}$ which is fed to scan timer 56 by a line 60 and causes the scan timer to increase the scan rate by a factor of about 100. Thus, scan generator 57 scans legal channels at a much slower rate than restricted channels. Since restricted channels are scanned at about a rate of about 400 per second, scan generator 57 quickly scans through such channels to the next unrestricted channel. For example, even for the restricted channels 29–64 which total 36 channels, scan generator 57 scans through this string of restricted channels in less than 0.1 second such that it appears to the operator that the radio has skipped from the last unrestricted channel 28 to the next unrestricted channel 65.

If the operator releases CHAN UP button 53 or CHAN DN button 54 while scan generator 57 is scanning through a restricted channel, outputs from these buttons on respective lines 61 and 62 to scan latches 63 cause scan latch outputs on respective lines 64 and 65 to respective input terminals 5 and 6 of scan generator 57 to remain latched in a scan up or scan down condition until the next unrestricted channel is reached. Similarly if button 53 or 54 is pulsed to step to the next channel and the next channel is restricted, ROM decoder 59 will latch latches 63 to cause scan generator 57 to scan through any restricted channels unil the next unrestricted channel is reached. When the next unrestricted channel is reached, ROM outputs at terminals 20 and 21 of scan generator 57 will no longer be a 01 code and $\overline{SKIP}$ output of ROM decoder 59 will assume a logic zero state and cause scan latches 53 to release input terminals 5 and 6 of scan generator 57 from the latched condition such that scan generator 57 ceases scanning and stops at the next unrestricted channel is neither button 53 nor button 54 are then depressed. WX and AI inputs to scan latches 63 prevent BCD counter 55 from being incremented or decremented during either the weather or memory modes.

In the select mode, which as previously discussed is determined by WEATHER button 48 and SEL/MEM button 50, the contents of BCD counter 55 are fed respectively through a multiplexer 67 (FIG. 3), an address decoder 68 and an buffer 69 to output terminals 11–18 of scan generator 57. Output terminals 11–14 are respectively units digit bits U1, U2, U4 and U8 and output terminals 15–18 are respectively tens digit bits T1, T2, T4 and T8. These units and tens bits are shown in Table 1. A digit decoder 70 (FIG. 2) converts the BCD input of units bits U1, U2, U4 and U8 from respective output terminals 11–14 of scan generator 57 to provide appropriate output signals on seven output lines 71 to drive a seven segment digit display in a liquid crystal display (LCD) 72 to provide the appropriate units digit for the selected channel. Similarly, digit decoder 70 decodes tens digit bits T1, T2, T4 and T8 from respective output terminals 15–18 of scan generator 57 to provide appropriate output signals on seven output lines 73 for driving another seven segment digit display in liquid crystal display 72 for visually indicating the tens digit of the selected channel. As can be seen in Table 1, channel 88 duplex has a BCD decode of 89 of distinguish from simplex channel 88. A channel 88 duplex decoder 74 is provided to determine when BCD code 89 is present to provide a U1 output to digit decoder 70 of a logic zero level to cause LCD 72 to display the selected channel as 88 although a BCD representation of 89 is present at terminals 11–18 of scan generator 57.

A memory load mode of operation is enabled when a MEM LOAD button 80 is pulsed. Button 80 is connected to output terminal WX of output mode selection circuit 47 to prevent loading of a new channel into memory when operating in the weather mode. Pulsing of button 80 causes the contents of BCD counter 55 to be loaded into a memory 81 in scan generator 57. A memory load gate 82 interposed between button 80 and input terminal 25 of scan generator 57 prevents the operator from loading a channel into memory 81 when accessing a channel in memory, as by pulsing SEL/MEM button 50. When in the memory load mode, address output lines 11–18 of scan generator 57 feed the contents of memory 81 to digit decoder 70 such that the loaded channel is displayed by LCD 72.

Pulsing of WEATHER button 48 causes all operational modes of scan generators 57 to be disabled. Weather channel selection is accomplished by a two digit counter in a weather channel selection circuit 84 which receives the WX output from mode selection circuit 47. This counter in weather channel selection circuit 84 can be programmed to initialize on any of the four weather channels when button 48 is pressed. Circuit 84 also receives scan up output from CHAN UP button 53 and is responsive thereto to increment the two bit counter in circuit 84 to sequentially select the other weather channels. Change in outputs $\overline{WX}$ and WX of mode selection circuit 47 when the output state of circuit 47 is changed to the weather mode by button 48 also changes the logic level at an I/O input terminal 10 of scan generator 57. This causes address lines 11–18 to become inputs rather than outputs. At the same time, a units gate 82 is enabled to present units bits U1, U2, U4 and U8 from weather channel selection circuit 84 to respective lines 11–14 of scan generator 46 and to the units portion of digit decoder 70 such that the selected weather channel is displayed by the units digit of LCD 72. When mode selection circuit 47 is changed to the weather mode, a tens gate 83 is enabled to ground the lines for tens digit bits T1, T1, T4 and T8 to present the proper channel designation code for the weather channels to address lines 15–18 of scan generator 57. Mode selection circuit 47 also drives a blanking input 75 of digit decoder 70 which blanks the tens digit of LCD 72 during the weather mode.

It is necessary to distinguish duplex channels from simplex channels since the receive and transmit carrier frequencies are not the same, as can be seen in Table 1. Instead, in duplex channel operation the received carrier frequency is 4.6 MHz higher than the transmit carrier frequency. As previously discussed, radio 30 is normally in a receive mode and may be changed to a transmit mode by pressing PTT switch on microphone 34. All duplex channels are assigned a unique 00 ROM code (Table 1). Radio 30 operates in the simplex mode during ROM codes 11 or 10 and, as previously discussed, a 01 ROM code causes scan generator 57 to operate in a skip mode to rapidly scan over illegal channels. The 00 ROM code for duplex channel operation at outputs 20 and 21 of scan generator 57 are decoded by ROM decoder 59 to provide a $\overline{DUPLEX}$ output on a line 76. This duplex output in combination with a $\overline{TX}/RX$ signal from the PTT switch on a line 77 are input to a range switching portion of frequency synthesizer 31 to cause a voltage controlled oscillator (VCO) to adjust to the proper frequency range for duplex transmit operations. Weather channels 1–4 are also assigned a 00 ROM code since the receive carrier frequencies of these channels are near the receive frequencies of the duplex channels, it being understood that transmission on these weather channels is not permitted.

Transmitter 40 (FIG. 1) is controlled by an output XMIT ENABLE from a transmit lockout circuit 85 to permit transmission only under certain operating conditions. When a weather channel is selected by weather button 48, a $\overline{WX}$ input into transmit lockout circuit 85 prevents transmitter 30 from being enabled. Similarly, when scan generator 57 is skipping over restricted channels, an illegal transmit output on a line 86 from ROM decoder 59 to lockout circuit 85 prevents transmitter 30 from being enabled. A LOCK signal from terminal 24 of scan generator 57 to lockout circuit 85 also prevents transmitter 30 from being enabled when a phase-locked loop portion of frequency synthesizer 31 is not in a phase-locked loop condition. Lastly, lockout circuit 85 receives an input from PTT switch on microphone 34 to enable transmitter 30 only when PTT switch is in the transmit position.

An LCD decoder 86 decodes the various operating conditions of radio 30 and enables display of certain operating modes in the operating mode portion of LCD display 72. A radio transmit operating mode is displayed as XMIT in display 72 when the XMIT ENABLE output of transmit lockout circuit 85 enables transmitter 30. The duplex channel operating mode is displayed as DUPLEX in display 72 when ROM decoder 59 decodes duplex operation for nonweather channels and provides an output on line 89. The weather channel operating mode is displayed as WX in display 72 during weather channel operation. LCD function decoder 86 is also responsive to output AI from scan generator 57 to cause the memory mode of operation to be displayed as MEM in LCD display 72. If neither WX or MEM is displayed in LCD display 72, the radio is operating in the select mode.

Digit decoder 70, LCD function decoder 86 and LCD display 72 are simultaneously clocked or gated by an LCD timing generator 87. The LCD timing generator operates at a relatively low frequency, such as 45 Hz, which is high enough to avoid any visual flicker in LCD display 72.

Scan generator and PLL control 57 is shown in block diagram form in FIG. 3. Scan generator 57 is an integrated circuit which is commercially available from Nitron of Cupertino, Calif. 95014 as part number NC6405. The terminal numbers referred to herein and in FIGS. 2 and 3 are the actual pin numbers for part NC6405. Scan generator 57 has three internal mask-programmable read-only memories (ROMs) including a dual 82 word by 13 bit ROM 90 and an 82 word by two bit ROM 91. A control portion 92 of a phase-locked loop (PLL) of frequency synthesizer 31 is also contained within scan generator 57. A nine bit binary counter 93 in PLL portion 92 divides a stable reference frequency signal FREF at terminal 22 by a factor of 512 to provide a lower reference frequency to a comparator 94. A nine bit programmable binary counter 95 divides an unknown PLL frequency FUNK 02 at terminal 28 and another phase of the unknown frequency FUNK 01 at terminal 27, the phases being in about 180° relationship, by a programmable divide ratio by dual ROM 90. The divide ratio from dual ROM 90 to programmable counter 95 depends upon the selected channel and upon whether radio 30 is in a receive or transmit mode for duplex channels. Programmable counter 95 therefore receives logic information from dual ROM 90 which is addressed by information in address decoder 68 and TX/RX input at terminal 2 selects the appropriate one of the dual 13 bit words addressed by address decoder 68 for transmit or receive operation. A logic zero at terminal 2 sends a transmit frequency divide ratio in programmable counter 95 and a logic one sends a receive frequency divide ratio in counter 95.

Comparator 94 compares the divided down low reference frequency from counter 93 with the divided unknown PLL frequency from counter 95 and indicates a phased locked condition of the PLL loop in the frequency synthesizer by outputting a logic one LOCK signal at terminal 24. A charge pump 96 is also responsive to comparator 94 to provide three-state error correction pulses at an output terminal 23 to an external voltage controlled oscillator (VCO). A programmable four bit binary counter 97 divides the PLL frequency FUNK at terminals 27 and 28 to cause a flip-flop 98, in combination with an output from counter 95, to provide an output signal at terminal 26 for controlling a variable modulus divider in the frequency synthesizer.

At the same time that address decoder 68 is causing dual ROM 90 to supply receive or transmit frequency information to PLL portion 92, address decoder 68 is also causing ROM 91 to supply an ROM code for the selected channel at terminals 20 and 21.

Address decoder 68 may receive channel information from different sources. In the select mode, the contents of BCD counter 55 are supplied to address decoder 68 by multiplexer (MUX) 67. In the memory mode, a logic one at the memory enable terminal 4 causes a flip-flop 100 to change state such that multiplexer 67 supplies channel information to address decoder 68 from memory 81. At the same time, flip-flop 100 outputs a control signal AI at terminal 3 which disables scan up or scan down operation and also disables loading of another channel into memory 81. In the weather mode, an I/O control signal at terminal 10 changes to a logic one state which disables multiplexer 67 and enables buffer 69 to supply address information from weather channel selection circuit 84 (FIG. 2) on address lines 11-18 of scan generator 57 and through buffer 69 to address decoder 68. Address decoder 68 then supplies weather channel receive frequency information from ROM 90 to PLL portion 92. When I/O terminal 10 is in a logic zero level, buffer 69 outputs address information in address decoder 68, which was received from either BCD counter 55 or memory 81, onto address lines 11-18.

BCD up/down counter 55 is programmable to change from BCD address code 89 to BCD address code 06 such that restricted channels 5 and 89-99 are not accessed in the scan up or scan down modes. It is understood from the previous discussion that BCD code 89 is for channel 88 duplex and not for channel 89. Thus, the only restricted channels of concern in either scanning mode are channels 29-64 and 75 and 76. BCD counter 55 is also programmed to initialize on channel 16 which is the calling and emergency channel and which the Federal Communications Commission (FCC) rules require all marine radio operators to monitor.

An oscillator and timing circuit 101 controls the up or down count of BCD counter 55 and is normally in an off condition. A pulsed logic zero at either scan up terminal 5 or scan down terminal 6 will enable oscillator 101 to cause BCD counter 55 to either increment or decrement BCD counter 55 by one channel in the instructed direction. If terminal 5 or 6 is held in a logic zero, oscillator 101 will continue to increment or decrement BCD counter 55, for example, at the rate of about 4 channels per second when RC terminal 9 has a 68 k ohm resistor to a positive supply voltage and a 0.1 microfarad capacitor to ground. Fast up and fast down terminals 7 and 8 are not used and are connected to a logic one level. If either of these terminals were switched to a logic zero, the scan rate of BCD counter 55 is increased by a factor of four in comparison to controlling scan up terminal 5 or scan down terminal 6.

With reference now to FIG. 4 and Table 1, the channel scanning mode will be considered in greater detail. When a restricted channel, such as any one of channels 29-64 or 75-76 is first accessed, a 01 ROM code will appear at terminals 20 and 21 of scan generator 57 from ROM 91 in FIG. 3. The zero logic level at terminal 20 is inverted to a logic one level by an inverter 105 and presented to one input terminal of a NAND gate 106 in ROM decoder 59. The logic one level at terminal 21 is presented directly to another input terminal of NAND gate 106 and the $\overline{SKIP}$ output of NAND gate 106 thereupon changes to a logic zero level. This logic zero skip level renders an NPN transistor 107 in scan timer 56 nonconductive. Transistor 107 controls an RC timing circuit including a resistor 108 connected between a positive voltage supply and the RC terminal 9 of scan generator 57, a timing capacitor 109 of about the 0.1 microfarads also connected to RC terminal 9 with the other terminal of capacitor 109 connected to the collector of transistor 107, and a second timing capacitor 110 connected between the collector of transistor 107 to ground. Prior to receiving a logic zero level on $\overline{\text{SKIP}}$ output from ROM decoder 59 due to selection of restricted channel, transistor 107 in scan timer 56 is ordinarily conductive thereby effectively grounding one terminal of capacitor 109 to short out capacitor 110. RC terminal 9 of scan generator 57 then sees an RC time constant determined by resistor 108 and capacitor 109 which may typically be about $6.8 \times 10^{-3}$ seconds to cause scan generator 57 to scan about four channels per second when in the scan or scan down mode. When transistor 107 in scan timer 57 is rendered nonconductive by a logic zero state on $\overline{\text{SKIP}}$ output line of ROM decoder 59, the collector of transistor 107 exhibits a high impedance level which causes capacitor 110 to be placed in series circuit with capacitor 109 such that the effective capacitance between RC terminal 9 and ground is then determined by the considerably lower capacitance of capacitor 110, for example, about 0.001 microfarads. The RC time constant seen by terminal 9 of scan generator 57 is then about $6.8 \times 10^{-5}$ seconds such that the frequency of oscillator 101 (FIG. 3) in scan timer 57 is increased by a factor of 100 and BCD counter 55 similarly increases its counting by a factor of 100 thereby causing any restricted channels to be scanned through at a rate of about 400 per second. As soon as the next unrestricted channel is reached, ROM code on ROM output lines 20 and 21 will no longer be a 01 code which will cause $\overline{\text{SKIP}}$ output of ROM decoder 59 to again assume a logic one state. Transistor 107 will then again be rendered conductive such that one terminal of capacitor 109 will be effectively grounded through the low impedance at the collector of transistor 107 to cause scan generator 57 to again resume the normal scan rate of about four channels per second.

ROM decoder 59 also decodes a 10 code at output terminals 20 and 21 to provide an ILLEGAL XMIT output signal on line 88 to transmit lockout circuit 85 (FIG. 2). ROM decoder 59 also decodes a 00 ROM code at output terminals 20 and 21 of scan generator 57 to provide $\overline{\text{DUPLEX}}$ and DUPLEX outputs on respective lines 76 and 89 to a range switching portion of frequency synthesizer 31 (FIG. 1) and to LCD function decoder 86 (FIG. 2).

Scan latches 63 in FIG. 4 inhibit either scan up or scan down operation of scan generator 57 when the radio is in the weather mode or in the memory mode and also latches terminal 5 or 6 of scan generator 57 in the respective scan up or scan down mode until the next unrestricted channel is reached. Weather mode output signal $\overline{\text{WX}}$ from mode selection circuit 47 (FIG. 2) and memory mode control signal AI from terminal 3 of scan generator 57 are fed to respective inputs of an AND gate 112. The output of AND gate 112 is fed to an input terminal of a NAND gate 113 interposed in scan up line 61 and to an input terminal of a NAND gate 114 interposed in scan down line 62. If either signal $\overline{\text{WX}}$ or AI changes to a logic zero level indicating a weather mode or a memory mode, respectively, the output of NAND gate 113 or NAND gate 114 will be inhibited from changing state in response to respective scan up or scan down inputs. Also interposed in the scan up and scan down lines at the outputs of NAND gates 113 and 114 are respective pairs of cross-coupled NAND gates 115-116 and 117-118, respectively. One input terminal of gate 115 in the scan up line is responsive to the output of gate 113 and one input of gate 117 in scan down line is similarly responsive to the output of gate 114. Gates 116 and 118 each have an input responsive to a SKIP signal from an inverter 119 interposed in the $\overline{\text{SKIP}}$ line from ROM decoder 59. An inverter 120 is interposed between the output of gate 115 and SCAN UP terminal 5 of scan generator 57 and another inverter 121 is similarly interposed between the output of gate 117 and the SCAN DN terminal 6 of scan generator 57.

It will be recalled that terminals 5 and 6 of scan generator 57 are responsive to a logic zero level to initiate to the scan up or scan down modes of operation. The scan up mode is initiated by a logic one level on line 61 to gate 113, the output of which presents a logic one level to an input of gate 115. The output of gate 115 thereupon changes to a logic one level to cause the output of inverter 120 to change to a logic zero level at terminal 5 of scan generator 57. If scan generator 57 in sequentially scanning channel numbers in an increasing direction reaches a restricted channel, address decoder 68 (FIG. 3) will cause ROM 91 to output a 01 code on ROM output terminals 20 and 21. ROM decoder 59 will then decode the 01 code to cause $\overline{\text{SKIP}}$ output to drop to a logic zero level which, besides rendering transistor 107 in scan timer 56 nonconductive, will cause inverter 119 in scan latches 63 to present a logic one level to an input terminal of NAND gate 116. The logic one level at an input of NAND gate 116 will cause the output of NAND gate 115, with which NAND gate 116 is cross-coupled, to remain at a logic one level until $\overline{\text{SKIP}}$ line of ROM decoder 59 assumes a logic one level when the next unrestricted channel having a non-01 ROM code is reached. When $\overline{\text{SKIP}}$ line assumes the logic one level, NAND gate 115, and hence input terminal 5 of scan generator 57, will be released from the latched condition.

If SCAN UP input to scan latches 63 remains at a logic one level, scan generator 57 will continue to sequentially scan up through the channels. If the scan up button 53 (FIG. 2) was released during the latched condition of NAND gate 115, the SCAN UP input to scan latches 63 will be a logic zero level and the output of NAND gate 113 will be a logic one level, which will cause the output of NAND gate 115 to immediately assume a logic zero level upon being released from the latched condition. The logic zero level of NAND gate 115 is inverted by inverter 120 to a logic one level at SCAN UP terminal 5 of scan generator 57 which will cause scanning operation to be immediately terminated upon reaching the next unrestricted channel.

Gate 114, cross-coupled gates 116-117 and inverter 121 in SCAN DN line 62 operate similarly to the corresponding SCAN UP line 61 components to latch SCAN DN terminal 6 of scan generator 57 during scanning in the scan down mode through restricted channels until the next unrestricted channel is reached.

The present invention is also concerned with methods of scanning through restricted channels at a faster rate than through unrestricted channels such that it appears to the radio operator that the restricted channels are being skipped. The method includes the steps of sequentially scanning through a plurality of channels at a predetermined scanning rate, decoding a coded signal to determine whether each channel is a restricted channel or an unrestricted channel, and responding to restricted channel determinations to cause said channel scanning means to scan through any unrestricted channels at a faster scanning rate. Preferably the first predetermined scanning rate for unrestricted channels is about four channels per second and the second scanning rate for restricted channels is about 100 times faster, i.e. about 400 channels per second. The method also includes the additional step of latching the sequential scanning means in the second and faster restricted channel scanning rate until the next unrestricted channel is detected such that the sequential scanning of channels does not stop on a restricted channel due to any change in operator input.

While a embodiment of the invention has been shown and described, it will be obvious to those skilled in the art that changes and modifications may be made without departing from the invention in its broader aspects, and, therefore, the aim of the appended claims is to cover all such changes and modifications as as fall within the true spirit and scope of the invention.

We claim:

1. A channel selector system in a two-way radio for selecting one of a plurality of channels each having a different carrier wave frequency, said radio having a frequency synthesizer responsive to a channel selector to generate a predetermined frequency associated with each selected channel to enable said radio to receive information from the selected channel or to transmit information on the selected channel, said channel selector system comprising:

display means for displaying the selected channel;
   sequential generating means for controlling said frequency synthesizer and causing said frequency synthesizer to sequentially access an adjacent channel of said plurality of channels, at least some of said plurality of channels being restricted for either reception, transmission, or both, said sequential generating means also providing a first predetermined output code for any channels which are restricted, and a second predetermined output code for any channels which are unrestricted;
   decoding means responsive to the first output code from said sequential generating means to provide an output signal to indicate when a restricted channel has been sequentially accessed,
   timer means responsive to the output signal from the decoding means when indicative that a restricted channel has been accessed to cause said sequential generating means to rapidly scan through any restricted channel to the next unrestricted channel whereby said channel display means does not visually display any restricted channels and gives the appearance that the restricted channels are skipped; and
   latching means also responsive to the output signal from said decoding means to latch said sequential generating means during access of any restricted channel such that the sequential generating means continues to scan through any restricted channels at the rapid restricted scanning rate until the next unrestricted channel is accessed, said latching means further adapted to disable said channel selector during rapid scanning over restricted channels to prevent any subsequent change in channel selector input from accessing a restricted channel.

2. The channel selector system as defined in claim 1 wherein said sequential generating means sequentially accesses one of said plurality of channels in either a channel up or channel down mode.

3. The channel selector system as defined in claim 1 further comprising operator control means for causing said sequential generating means to sequentially scan through at least a portion of said plurality of channels at a predetermined scanning rate which permits visual display of the scanned unrestricted channels on said channel display means.

4. The channel selector system as defined in claim 3 wherein the rapid restricted channel scanning rate is about 100 times faster than the predetermined scanning rate for unrestricted channels.

5. The channel selector system as defined in claim 3 wherein said timer means comprises oscillator means responsive to a resistance-capacitance circuit which determines the predetermined scanning rate for unrestricted channels, and semiconductive switch means responsive to the output signal from said decoding means to change the time constant of said resistance-capacitance circuit when the output signal of said decoding means indicates that said sequential generating means has accessed a restricted channel.

6. A channel selector system as defined in claim 5 wherein said semiconductive switch means changes the time constant of said resistance-capacitance circuit by changing the effective capacitance therein.

7. A method for displaying channel numbers in a two-way radio having a frequency synthesizer and sequential generating means for sequentially causing the frequency synthesizer to access an adjacent channel, at least some of said plurality of channels being restricted for either reception, transmission, or both, said method comprising the steps of:

selecting an adjacent channel by means of a control input to said sequential generating means;
   providing a first predetermined output code from said sequential generating means for the selected adjacent channel if said channel is unrestricted and a second predetermined code if said selected adjacent channel is restricted;
   decoding the output code from said sequential generating means to determine whether the selected adjacent channel is a restricted channel,
   supplying a timing signal to said sequential generating means upon determining that a restricted channel has been selected such that said sequential generating means rapidly scans through any restricted channels to the next unrestricted channel and said restricted channel is not visually displayed;
   latching said sequential generating means in the rapid scan mode of operation when the decoded output code indicates that a restricted channel has been accessed; and
   disabling channel selecting means during access of a restricted channel to prevent any subsequent change in the channel selector setting from accidentally accessing a restricted channel.

8. The method as defined in claim 7 wherein the step of supplying a timing signal to said sequential generating means comprises increasing the oscillation frequency of an oscillator by changing an RC time constant of a resistance-capacitance circuit associated with the oscillator in response to determining that a restricted channel has been accessed by decoding of the output code.

9. The method as defined in claim 7 wherein an adjacent channel may be selected either as a higher channel number or a lower channel number in response to said control input.

10. The method as defined in claim 7 wherein an adjacent channel may be selected by maintaining the control input to the signal generating means in a scan mode to cause the sequential generating means to scan through unrestricted channels at a predetermined scan rate which is significantly slower than the rapid scan rate through restricted channels such that unrestricted channels are visually displayed on said display means.

11. The method as defined in claim 10 wherein the rapid scan rate for restricted channels exceeds the predetermined scan rate for unrestricted channels by a factor of about 100.

* * * * *